United States Patent
Lustig et al.

[11] Patent Number: 6,159,815
[45] Date of Patent: Dec. 12, 2000

[54] METHOD OF PRODUCING A MOS TRANSISTOR

[75] Inventors: Bernhard Lustig, München; Herbert Schäfer, Höhenkirchen-Siegertsbrunn; Martin Franosch, München, all of Germany

[73] Assignee: Siemens Aktiengesellschaft, Munich, Germany

[21] Appl. No.: 09/269,311

[22] PCT Filed: Sep. 3, 1996

[86] PCT No.: PCT/DE97/01933

§ 371 Date: Jun. 4, 1999

§ 102(e) Date: Jun. 4, 1999

[87] PCT Pub. No.: WO98/13865

PCT Pub. Date: Apr. 2, 1998

[30] Foreign Application Priority Data

Sep. 27, 1996 [DE] Germany ............... 196 39 875

[51] Int. Cl.[7] .................................................. H01L 21/336
[52] U.S. Cl. ................... 438/305; 438/306; 438/307; 438/230
[58] Field of Search ................... 438/199, 222, 438/224, 230, 299, 300, 305, 306, 307

[56] References Cited

U.S. PATENT DOCUMENTS 4,838,993 6/1989 Aoki et al. .
5,491,099 2/1996 Hsu .
5,599,725 2/1997 Dorleans et al. ................. 437/40
5,663,083 9/1997 O et al. ................. 438/303

FOREIGN PATENT DOCUMENTS 0 218 408 4/1987 European Pat. Off. .
44 15 568 C2 11/1995 Germany .

OTHER PUBLICATIONS

Questel Plus—Epoque 8912.
Parrillo et al., "Disposable Polysilicon LDD Spacer Technology", IEEE Transactions on Electron Devices, vol. 38, No. 1, Jan. 1991, pp. 39–46.
Borland, "Selective Silicon Deposition for the Megabit Age", Solid State Technology, Jan. 1990, pp. 73–78.
Nakahara et al., "Ultra–shallow in–situ–doped raised source/drain structure for sub–tenth micron CMOS", Symposium of VLSI Technology Digest of Technical Papers, pp. 174–175.
Ohguro et al., "0.2 μm analog CMOS with very low noise figure at 2 Ghz operation", Symposium on VLSI Technology Digest of Technical Papers, pp. 132–133.

*Primary Examiner*—John F. Niebling
*Assistant Examiner*—Viktor Simkovic
*Attorney, Agent, or Firm*—Schiff Hardin & Waite

[57] ABSTRACT

In order to produce a MOS transistor with HDD profile and LDD profile, the HDD profile is firstly formed, followed by the LDD profile, in the area for the LDD profile in order to produce steep dopant profiles. The LDD profile is preferably produced by etching and in situ doped selective epitaxy.

3 Claims, 2 Drawing Sheets

METHOD OF PRODUCING A MOS TRANSISTOR

BACKGROUND OF THE INVENTION

1. Field of the Invention

The present invention relates generally to a method for producing a MOS transistor having an HDD profile and a LDD profile.

2. Description of the Related Art

In order to avoid short-channel effects, MOS transistors with short channel lengths are usually produced in such a way that the source/drain regions have an LDD (lightly doped drain) profile and an HDD (heavily doped drain) profile. The LDD profile has a lower dopant concentration and a smaller depth than the HDD profile. However, the LDD profile reaches closer to the gate electrode and dictates the channel length of the MOS transistor. By contrast, the HDD profile has a lower connection resistance.

In order to produce a MOS transistor with LDD and HDD profile, a gate dielectric and a gate electrode are firstly structured on the surface of a substrate. Using the gate stack, and optionally thin spacers (for example 20 nm) as a mask, the LDD profile is produced by implantation. Next, thick spacers are formed on the sides of the gate stack. Using the gate stack with the thick spacers as a mask, the HDD profile is then produced by implantation (for example T. Ohguro et al., VLSI Techn. Dig. (1996), page 132 or Y. Nakahara et al., VLSI Techn. Dig. (1996) page 174).

The minimum depths which can be achieved for the dopant profiles are limited by the heat treatment steps, which are needed for annealing and activating the implanted dopant.

SUMMARY OF THE INVENTION

An object of the invention is to provide a method for the production of a MOS transistor, with which small depths can be achieved for the dopant profiles close to the channel area.

This object and other objects are achieved according to the invention by a method for the production of a MOS transistor, in which a gate dielectric and a gate electrode are formed on the main face of a substrate, which comprises silicon at least at the main face, a first auxiliary layer is deposited with essentially conformal edge coverage, a second auxiliary layer, which can be etched selectively with respect to the first auxiliary layer, is deposited with essentially conformal edge coverage, spacers are formed at the sides of the gate electrode by anisotropically etching back the second auxiliary layer, implantation is carried out to form first subregions for source/drain regions, the spacers are removed selectively with respect to the first auxiliary layer, the surface of the substrate is etched in the areas where the two subregions for the source/drain regions are subsequently formed, and second subregions for the source/drain regions are formed by in situ doped selective epitaxy, the second subregions having a lower dopant concentration and a smaller depth than the first subregions. Further refinements of the invention are provided by the first auxiliary layer being formed from SiO2 and/or Si3N4, and the second auxiliary layer being formed from polysilicon. Preferably, at least one n-channel transistor and one p-channel transistor are formed, the first subregions for the n-channel transistor are firstly formed by implantation and subsequent heat treatment, the area for the p-channel transistor being covered with a first mask, the first subregions for the p-channel transistor are formed, the area for the n-channel transistor being covered with a second mask, the second mask and the spacers are removed, the second subregions for the n-channel transistor are formed by implantation and subsequent heat treatment, the area for the p-channel transistor being covered with a third mask, a fourth mask, which covers the area for the n-channel transistor, is formed after the third mask has been removed, the surface of the substrate is exposed and subsequently etched in the area of the second subregions of the p-channel transistor, and the second subregions for the p-channel transistor are formed by in situ doped selective epitaxy.

In the method according to the invention, the source/drain regions of the MOS transistor each comprise a first subregion and a second subregion. The first subregion corresponds to the HDD profile known from the literature. The second subregion corresponds to the LDD profile known from the literature. In the method according to the invention, after formation of a gate stack which comprises the gate dielectric and the gate electrode, a first auxiliary layer is deposited with essentially conformal edge coverage. On this, a second auxiliary layer, which can be etched selectively with respect to the first auxiliary layer, is deposited with essentially conformal edge coverage. Spacers are formed at the sides of the gate electrodes by anisotropically etching back the second auxiliary layer. After this, the first subregions of the source/drain regions are produced by implantation. After the spacers have been selectively removed, the second subregions for the source/drain regions are formed. The second subregions have a lower dopant concentration and a smaller depth than the first subregions. Their lateral extent is closer to the gate electrode, since the spacers had limited the lateral extent of the first subregions.

Since, in the method according to the invention, the second subregions are formed after the first subregions, they are not subjected to the thermal loading during subsequent formation of the first subregions. Divergence of the dopant profiles of the second subregions in the channel area is therefore avoided. As a result, a steeper dopant profile is achieved, which is desirable in terms of the short-channel behavior of the MOS transistor.

The second subregions are formed by a procedure whereby, after the spacers have been removed, the surface of the substrate is etched in the area where the second subregions are subsequently to be formed. To this end, the first auxiliary layer is removed in the area of the second subregions. Etching the surface of the substrate in this area produces indentations which are then filled by in situ doped selective epitaxy. During the epitaxy, a doped region, whose crystal quality corresponds to the crystal quality of the substrate and in which the dopant is already activated, grows on the surface of the substrate. There is therefore no need for a heat treatment step in order to activate the dopant. The dopant profile is determined by the selective epitaxy and is therefore very steep.

The substrate in which the MOS transistor is produced comprises monocrystalline silicon at least at the main face. The substrate used is preferably a monocrystalline silicon water or an SOI substrate. In the area of the channel region, and below this, silicon/germanium layers may in this case be provided.

Preferably, the first auxiliary layer is formed from $SiO_2$ and/or $Si_3N_4$ and the second auxiliary layer from polysilicon. Polysilicon can be etched with better selectivity with respect to $SiO_2$ and/or $Si_3N_4$.

For the production of complementary MOS transistors, it is advantageous firstly to form the first subregions for the n-channel transistor by implantation followed by heat treatment in order to anneal and activate the dopant. During the implantation, the area for the p-channel transistor is covered with a first mask. After the first mask has been removed, the first subregions for the p-channel transistor are formed. In this case, the area for the n-channel transistor is covered with a second mask. After this, the second mask and the spacers are removed. The p-channel transistor is covered with a third mask. The second subregions for the n-channel transistor are formed by implantation. After the third mask has been removed, the dopant in the second subregions for the n-channel transistor and in the first subregions for the p-channel transistor is activated in a subsequent heat treatment step. After this, a fourth mask is formed which covers the area for the n-channel transistor. The first auxiliary layer is removed in the area of the p-channel transistor. The surface of the substrate is etched in the area for the second subregions of the p-channel transistor. The effect of this is to produce indentations in the surface of the substrate in this region. Next, the second subregions for the p-channel transistor are formed by in situ doped selective epitaxy. Since, in this method, the implantations with the n-doped ions are carried out first, and the second p-doped subregions are then formed, equally flat dopant profiles can be produced for the n-channel and p-channel transistor in spite of the larger range of the p-doping ions in the crystal.

BRIEF DESCRIPTION OF THE DRAWINGS

The invention will be explained in more detail below with reference to an illustrative embodiment which is represented in the figures.

DETAILED DESCRIPTION OF THE PREFERRED EMBODIMENTS

Figure 1:
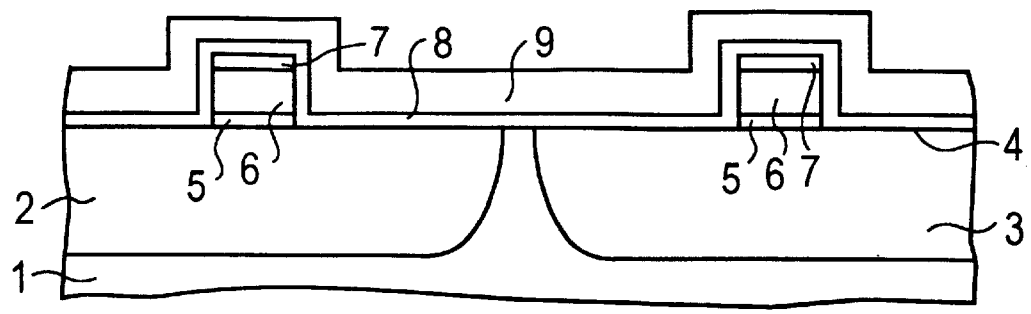
FIG. 1 shows a substrate with an area for an n-channel transistor and an area for a p-channel transistor, after formation of the gate dielectric and gate electrode, first auxiliary layer and second auxiliary layer.

A p-doped well 2 and an n-doped well 3 are formed in known fashion in a substrate 1 of, for example, monocrystalline silicon. The p-doped well 2 and the n-doped well 3 each adjoin a main face 4 of the substrate 1. The p-doped well 2 is -designed to accommodate an n-channel transistor and the n-doped well 3 to accommodate a p-channel transistor (see FIG. 1). The dopant concentration in the p-doped well 2 is, for example, $3 \times 10^{17}$ cm$^{-3}$, and the dopant concentration in the n-doped well 3 is, for example, $5 \times 10^{17}$ cm$^{-3}$.

A respective gate dielectric 5, for example of thermal SiO$_2$, with a layer thickness of for example 3 nm, is formed on the main face 4, in each case for the n-channel transistor and for the p-channel transistor. Further, a respective gate electrode of, for example, doped polysilicon with a gate length of for example 100 nm and a respective cover layer 7 which covers it and is for example made of SiO$_2$ are in each case formed for the n-channel transistor and for the p-channel transistor. The gate dielectric 5, the gate electrode 6, and the cover layer 7 are, for example, produced by depositing corresponding layers and structuring these layers together. The gate electrode 6 has a thickness of for example 200 nm, and the cover layer 7 has a thickness of for example 50 nm. As an alternative, the gate electrode 6 is formed with the aid of a spacer technique.

Next, a first auxiliary layer 8 of, for example TEOS-SiO$_2$ or Si$_3$N$_4$ is deposited surface-wide. The first auxiliary layer 8 has essentially conformal edge coverage. The first auxiliary layer 8 is deposited with a thickness of for example 10 nm.

Next, a second auxiliary layer 9 is deposited with essentially conformal edge coverage. The second auxiliary layer 9 is, for example, deposited from polysilicon with a layer thickness of 60 nm.

Figure 2:
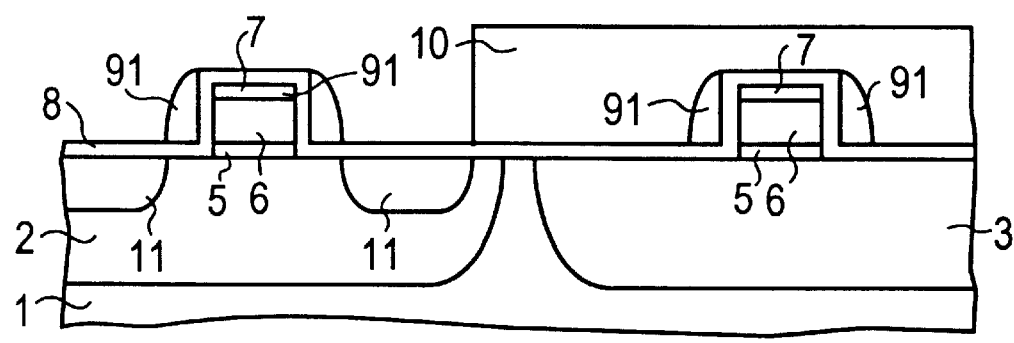
FIG. 2 shows the substrate after formation of first subregions for the n-channel transistor.

Spacers 91 are formed (see FIG. 2) from the second auxiliary layer 9 by anisotropically etching the second auxiliary layer 9 selectively with respect to the first auxiliary layer 8 (for example with HBr). The spacers 91 are arranged, separated by the first auxiliary layer 8, on the sides of the gate electrodes 6.

A first mask 10 which covers the n-doped well 3 is formed, for example, from photoresist. Next, implantation is carried out to form first subregions 11 for the source/drain regions of the n-channel transistor. In this case, the first mask 10 and the gate electrode 6, with the first auxiliary layer 8 and the spacers 91, act as a mask. The implantation is, for example, carried out with arsenic at a dose of $2 \times 10^{15}$ cm$^{-2}$ at 30 keV (see FIG. 2). The first mask 10 is removed. Next, a heat treatment step at for example 900° C. for 30 seconds is carried out in order to anneal implantation damage and drive the dopant into the first subregions 11 and activate it.

Figure 3:
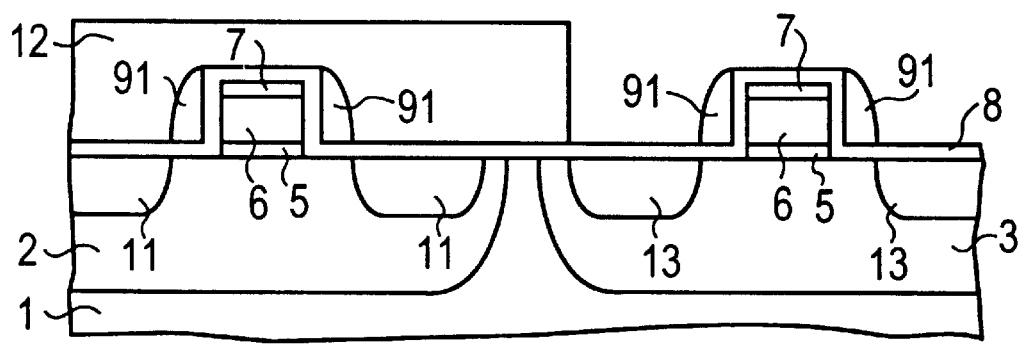
FIG. 3 shows the substrate after formation of first subregions for the p-channel transistor.
Figure 4:
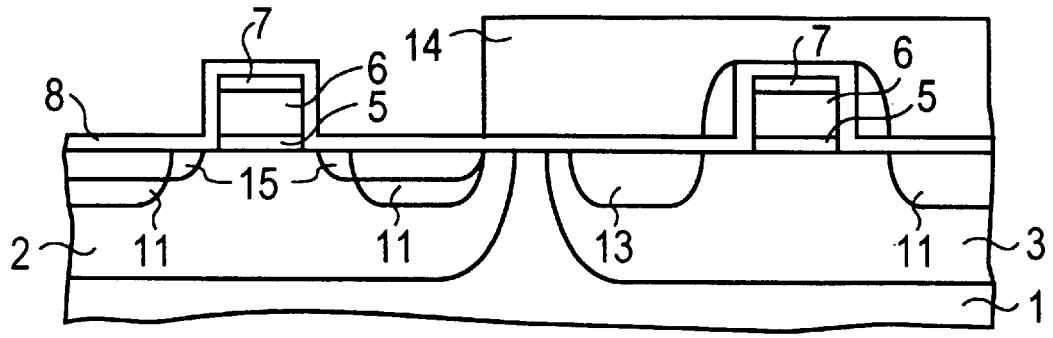
FIG. 4 shows the substrate after formation of second subregions for the n-channel transistor.

A second mask 12 is formed, which covers the p-doped well 2. Implantation is carried out to form first subregions 13 for the source/drain regions for the p-channel transistor. In this case, the second mask 12 and the gate electrode 6, with the first auxiliary layer 8 and the spacers 91, act as a mask. The implantation is, for example, carried out with boron at a dose of $2 \times 10^{15}$ cm$^{-2}$ and an energy of 10 keV (see FIG. 3).

The second mask 12 is removed. The spacers 91 are then removed, for example by wet chemical etching with choline. A third mask 14 is formed, which covers the n-doped well 3. In order to form second subregions 15 for the n-channel transistor, implantation is carried out during which the third mask 14 and the gate electrode 6 of the first auxiliary layer 8 act as a mask. The implantation is, for example, carried out with arsenic at a dose of $2 \times 10^{14}$ cm$^{-2}$ and an energy of 10 keV. The third mask 14 is removed. A heat treatment step is then carried out to anneal implantation damage and to activate the dopant in the first subregions of the p-channel transistor and the second subregions 15 of the n-channel transistor. In order to avoid divergence of the dopant profiles, this heat treatment step is carried out with a steep temperature profile. It is, for example, carried out at 850° C. for 20 seconds.

A fourth mask 16, which covers the p-doped well 2, is formed from, for example, photoresist. Spacers 81 are formed by anisotropic etching for the part of the first auxiliary layer 8 exposed in the area of the p-channel transistor. The anisotropic etching is carried out, for example, with an anisotropic CHF$_3$ and CF$_4$ etching process.

Figure 5:
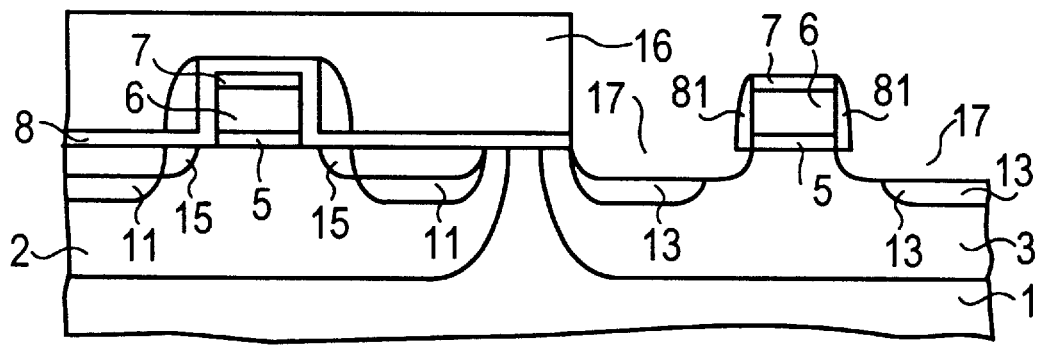
FIG. 5 shows the substrate after etching of the surface of the substrate in the area of the p-channel transistor.
Figure 6:
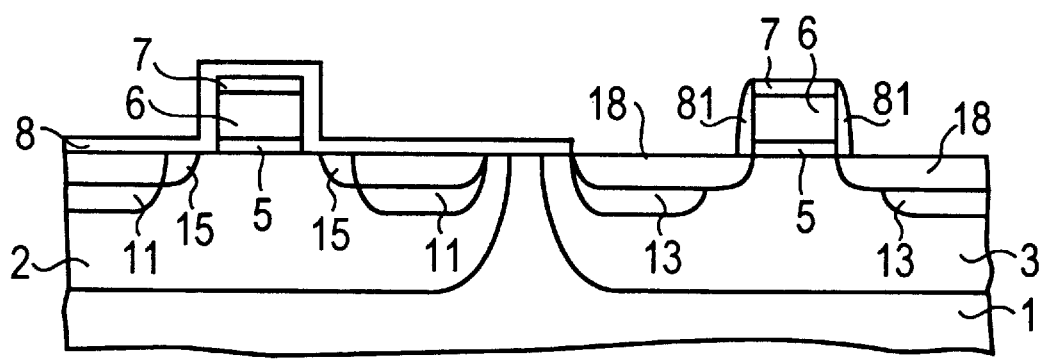
FIG. 6 shows the substrate after formation of second subregions for the p-channel transistor.

The surface of the substrate is exposed in the area of the p-channel transistor by the formation of the spacers 81. The surface of the substrate is subsequently etched. The etching is carried out isotropically. This forms indentations 17 which, because of the isotropic etching, extend under the spacers 81. The indentations 17 may even extend under the gate dielectric 6. The isotropic etching is, for example, carried out with choline. The depth of the indentations 17 is, for example, 15 nm (see FIG. 5).

In situ or boron-doped selective epitaxy is then carried out to form second subregions 18 for the p-channel transistor. To this end, after wet cleaning, for example in an HF dip, low temperature cleaning is carried out at, for example, 750° C. in the epitaxy reactor by addition of, for example, $GeH_4$ or $SiH_4$. In this case, native oxide found on the surface of the indentations 17 is etched away. The indentation 17 is then filled by selective, in situ doped epitaxial silicon deposition. The epitaxial silicon deposition is carried out, for example, with the use of a process gas which implements $H_2$, $SiH_2Cl_2$, HCl and $B_2H_6$ in a temperature range of between 700° C. and 800° C. and in a pressure range of between 10 and 100 torr. The effect of adding $B_2H_6$ is that boron is incorporated as a dopant in the second subregions 18. A stepped dopant profile is thereby produced. A heat treatment step for annealing or activating the dopant is not necessary after the in situ doped epitaxy, so that the stepped dopant profile is kept in the second subregions 18.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for the production of a MOS transistor, comprising the steps of:

forming a gate dielectric and a gate electrode on a main face of a substrate, said substrate being silicon at least at the main face, depositing a first auxiliary layer with essentially conformal edge coverage, depositing a second auxiliary layer with essentially conformal edge coverage, said second auxiliary layer being of a material which can be etched selectively with respect to the first auxiliary layer, forming spacers at sides of the gate electrode by anisotropically etching back the second auxiliary layer, carrying out implantation to form first subregions for source/drain regions, selectively removing the spacers with respect to the first auxiliary layer, etching a surface of the substrate in the areas where two subregions for the source/drain regions are subsequently formed, and forming second subregions for the source/drain regions by in situ doped selective epitaxy, the second subregions having a lower dopant concentration and a smaller depth than the first subregions.

2. A method as claimed in claim 1, wherein the first auxiliary layer is formed from SiO2 and/or Si3N4, and the second auxiliary layer is formed from polysilicon.

3. A method as claimed in claim 1, further comprising the step of:

forming at least one n-channel transistor and one p-channel transistor, forming the first subregions for the n-channel transistor firstly by implantation and subsequent heat treatment, an area for the p-channel transistor being covered with a first mask, forming the first subregions for the p-channel transistor, the area for the n-channel transistor being covered with a second mask, removing the second mask and the spacers, forming the second subregions for the n-channel transistor by implantation and subsequent heat treatment, the area for the p-channel transistor being covered with a third mask, forming a fourth mask which covers an area for the n-channel transistor after the third mask has been removed, exposing and subsequently etching the surface of the substrate in the area of the second subregions of the p-channel transistor, and forming the second subregions for the p-channel transistor by in situ doped selective epitaxy.

* * * * *